United States Patent
Pindl et al.

(10) Patent No.: US 10,910,789 B2
(45) Date of Patent: Feb. 2, 2021

(54) DEVICE HAVING A REINFORCEMENT LAYER AND METHOD FOR PRODUCING A DEVICE

(71) Applicant: OSRAM Opto Semiconductors GmbH, Regensburg (DE)

(72) Inventors: Markus Pindl, Tegernheim (DE); Bernhard Stich, Nittendorf (DE); Andreas Wojcik, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 19 days.

(21) Appl. No.: 16/471,731

(22) PCT Filed: Mar. 12, 2018

(86) PCT No.: PCT/EP2018/056064
§ 371 (c)(1),
(2) Date: Jun. 20, 2019

(87) PCT Pub. No.: WO2018/166964
PCT Pub. Date: Sep. 20, 2018

(65) Prior Publication Data
US 2019/0334312 A1    Oct. 31, 2019

(30) Foreign Application Priority Data

Mar. 13, 2017 (DE) .......................... 10 2017 105 235

(51) Int. Cl.
*H05K 7/00* (2006.01)
*H01S 5/02208* (2021.01)
(Continued)

(52) U.S. Cl.
CPC ...... *H01S 5/02208* (2013.01); *H01S 5/02228* (2013.01); *H01S 5/0612* (2013.01);
(Continued)

(58) Field of Classification Search
CPC ............. H01S 5/02208; H01S 5/02228; H01S 5/0612; H05K 1/181; H05K 2201/10106;
(Continued)

(56) References Cited

U.S. PATENT DOCUMENTS 7,208,337 B2    4/2007   Eisert et al.
7,763,478 B2    7/2010   Loh et al.
(Continued)

FOREIGN PATENT DOCUMENTS

DE         69218431 T2    9/1997
DE         10245631 A1    4/2004
(Continued)

*Primary Examiner* — Yuriy Semenenko
(74) *Attorney, Agent, or Firm* — Slater Matsil, LLP

(57) ABSTRACT

A device having a reinforcement layer and a method for producing a device are disclosed. In an embodiment a device includes a carrier plate, an electronic component, a shaped body and a reinforcement layer, wherein the electronic component is laterally enclosed by the shaped body, wherein, in a vertical direction, the electronic component is arranged between the carrier plate and the reinforcement layer, wherein the shaped body has a thermal expansion coefficient which is at least three times as large as a thermal expansion coefficient of the carrier plate and at least three times as large as a thermal expansion coefficient of the reinforcement layer, and wherein the carrier plate and the reinforcement layer adjoin the shaped body at least in places and are configured to reduce deformation of the shaped body in an event of temperature fluctuations.

18 Claims, 3 Drawing Sheets

(51) Int. Cl.
*H01S 5/022* (2021.01)
*H01S 5/06* (2006.01)
*H05K 1/18* (2006.01)

(52) U.S. Cl.
CPC ... *H05K 1/181* (2013.01); *H05K 2201/10106* (2013.01); *H05K 2201/10121* (2013.01)

(58) Field of Classification Search
CPC .......... H05K 2201/10121; H01L 33/54; H01L 33/56
See application file for complete search history.

(56) References Cited

U.S. PATENT DOCUMENTS

| | | | |
|---|---|---|---|
| 8,710,609 B2 | 4/2014 | Zitzlsperger et al. | |
| 8,731,346 B2* | 5/2014 | Tseng | G02B 6/12004 |
| | | | 385/14 |
| 9,018,661 B2 | 4/2015 | Pindl et al. | |
| 9,142,739 B2 | 9/2015 | Eder et al. | |
| 9,444,022 B2 | 9/2016 | Eisert et al. | |
| 2003/0151121 A1* | 8/2003 | Kuhara | G02B 6/421 |
| | | | 257/666 |
| 2004/0106234 A1* | 6/2004 | Sorg | H01L 21/565 |
| | | | 438/123 |
| 2005/0095752 A1 | 5/2005 | Liu | |
| 2009/0212316 A1 | 8/2009 | Braune et al. | |
| 2010/0061700 A1 | 3/2010 | Morimoto et al. | |
| 2010/0181582 A1 | 7/2010 | Li et al. | |
| 2011/0043719 A1* | 2/2011 | Thunhorst | G02F 1/133608 |
| | | | 349/58 |
| 2012/0141063 A1* | 6/2012 | Yamamoto | G02B 6/4214 |
| | | | 385/14 |
| 2013/0256862 A1* | 10/2013 | Zeiler | H01L 33/62 |
| | | | 275/676 |
| 2014/0003765 A1* | 1/2014 | Tseng | G02B 6/12004 |
| | | | 385/14 |
| 2016/0351758 A1* | 12/2016 | Herrmann | H01L 33/60 |
| 2017/0173580 A1* | 6/2017 | Lowe, Jr. | B01L 3/50273 |
| 2018/0212121 A1* | 7/2018 | Leirer | H01L 33/505 |

FOREIGN PATENT DOCUMENTS

| | | |
|---|---|---|
| DE | 102005041064 A1 | 3/2007 |
| DE | 102007039230 A1 | 3/2008 |
| DE | 102011053360 A1 | 3/2012 |
| DE | 102011003969 A1 | 8/2012 |
| DE | 102011050450 A1 | 11/2012 |
| DE | 102014113844 A1 | 3/2016 |
| WO | 2010091967 A1 | 8/2010 |

* cited by examiner

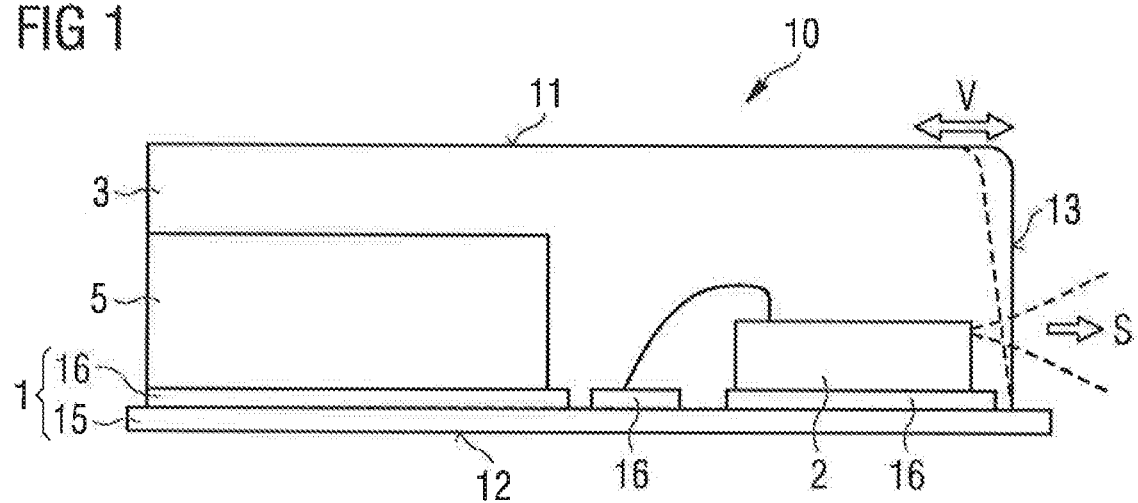
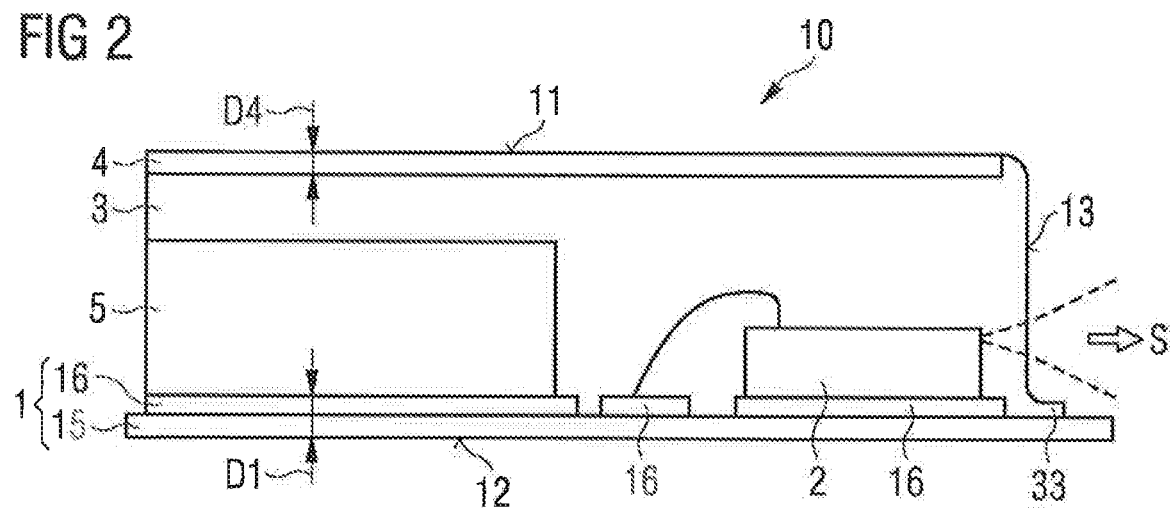

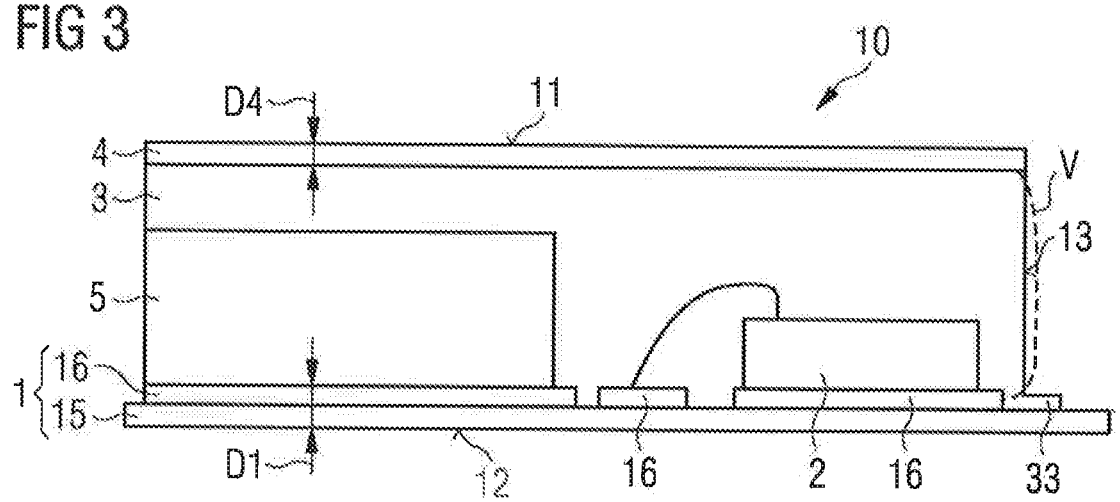
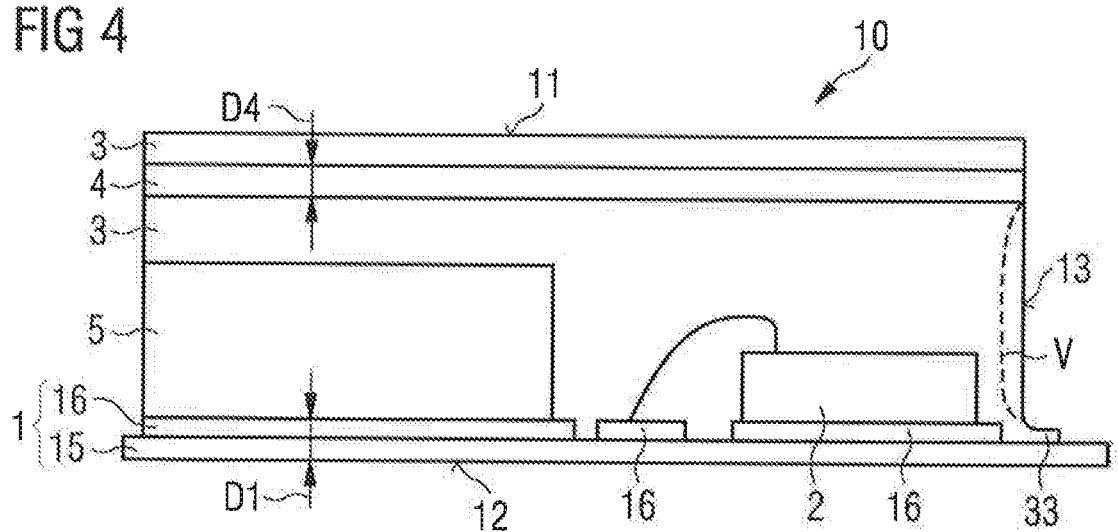

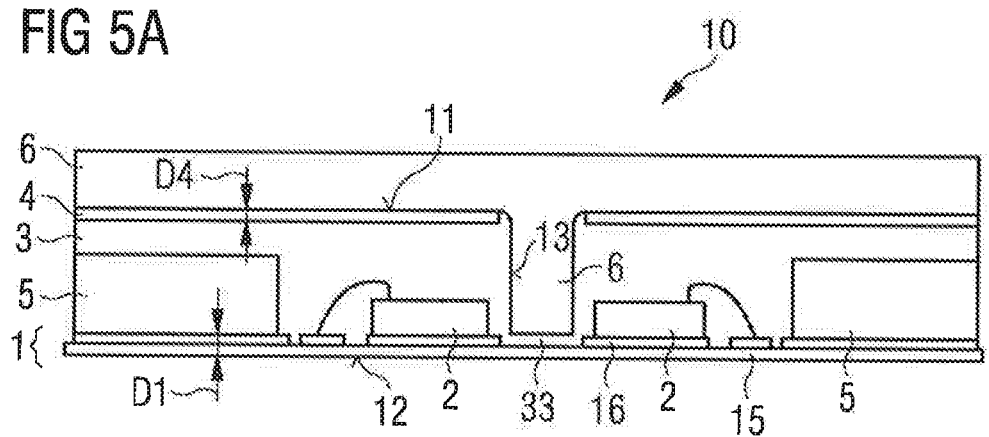
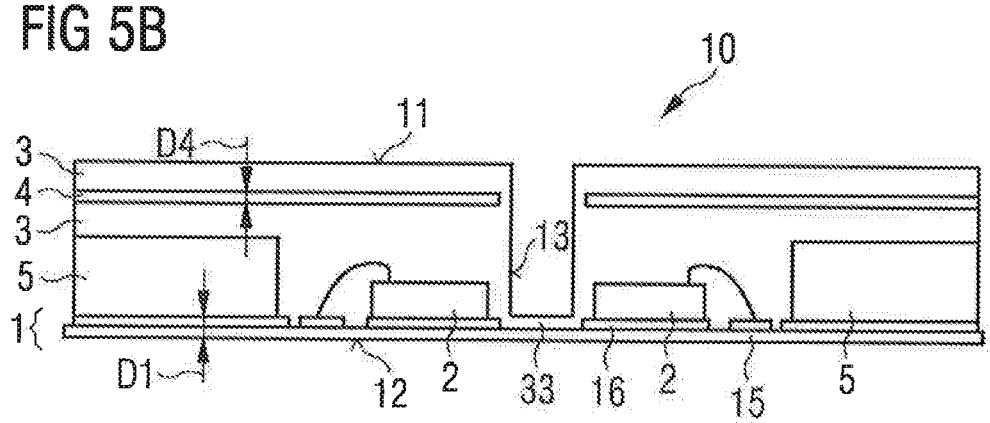

DEVICE HAVING A REINFORCEMENT LAYER AND METHOD FOR PRODUCING A DEVICE

This patent application is a national phase filing under section 371 of PCT/EP2018/056064, filed Mar. 12, 2018, which claims the priority of German patent application 102017105235.6, filed Mar. 13, 2017, each of which is incorporated herein by reference in its entirety.

TECHNICAL FIELD

A device having a reinforcement layer and its production are specified.

BACKGROUND

In the case of a device which has a component embedded in a casting body and, in particular, arranged on a printed circuit board, temperature fluctuations often lead to deformations due to different expansion coefficients of the shaped body and the printed circuit board. In particular, the casting body is deformed more strongly than the embedded component or the printed circuit board. In order to reduce the deformation, materials of the casting body and the printed circuit board can be adapted to each other, but this leads to a strong restriction in the choice of materials.

SUMMARY OF THE INVENTION

Embodiments provide a device that can be produced inexpensively and is stable against temperature fluctuations. Further embodiments provide an efficient method for providing such a device.

In at least one embodiment of a device, it comprises a carrier plate, a shaped body and a reinforcement layer. In particular, the device has a component, such as an electronic component, which is laterally enclosed by the shaped body. In the vertical direction, the electronic component is arranged between the carrier plate and the reinforcement layer. For example, the component can be externally electrically connected via the carrier plate. Apart from a surface facing the carrier plate, the component can be completely enclosed by the shaped body. The shaped body has a coefficient of thermal expansion which is at least three times as large as a coefficient of thermal expansion of the carrier plate and at least three times as large as a coefficient of thermal expansion of the reinforcement layer. The carrier plate and the reinforcement layer adjoin the shaped body at least in places and are configured to reduce mechanical, in particular asymmetrical, deformation of the shaped body, for example, in the event of temperature fluctuations.

Since the shaped body having a comparatively greater coefficient of thermal expansion is arranged at least partially between the carrier plate and the reinforcement layer each having a lower coefficient of thermal expansion, the stresses occurring for instance as a result of temperature fluctuations in the shaped body, are absorbed on both sides, namely by the carrier plate and by the reinforcement layer, so that deformation, in particular lateral deformation of the shaped body, is prevented. As a result of which, asymmetrical deformation of the shaped body, for example, in the form of lateral tilting of a side surface of the shaped body, is avoided or largely prevented. Preferably, the carrier plate and the reinforcement layer each adjoin directly to the shaped body or there is only a single bonding layer, such as an adhesive layer, arranged between the shaped body and the carrier plate or the reinforcement layer.

A vertical direction is understood to mean a direction directed transversely or perpendicularly to a main extension surface of the carrier plate or of the reinforcement layer. A lateral direction is understood to mean a direction that runs along, in particular parallel to, the main extension surface. The vertical direction and the lateral direction are thus transverse or substantially perpendicular to each other.

In case of doubt, the thermal expansion coefficient of a layer is understood to mean the average thermal expansion coefficient, in particular the average linear thermal expansion coefficient of this layer, which is determined under standard conditions. When comparing the coefficients of thermal expansion of different layers, the corresponding coefficients of thermal linear expansion can be determined under standard conditions and for instance at about 20° C. In particular, it is possible to interpret the coefficient of thermal expansion as the average coefficient of linear expansion in a temperature interval under consideration within a temperature range, for example, between −50° C. and 200° C. inclusive, for instance between −40° C. and 125° C. or between 0° C. and 100° C. inclusive, wherein the temperature interval is the absolute value of the associated temperature variation under consideration. For example, the average coefficient of linear expansion is determined over a temperature interval of for instance 10° C., 20° C., 30° C., 40° C. or 50° C. within the temperature range mentioned above.

According to at least one embodiment of the device the component is an optoelectronic component. In particular, the component is a laser diode in the form of a semiconductor laser chip or a general light-emitting semiconductor chip in the form of an LED. Preferably, the component is a laser diode, in particular an edge-emitting laser diode. Alternatively, the optoelectronic component can be a light-detecting semiconductor chip, such as a sensor or a photodetector. The shaped body has a side surface that serves as a light passage surface, for example, as a light-emitting surface or as a light-entering surface of the device.

The carrier plate and the reinforcement layer can thus be configured for reducing deformation of the side surface in the event of temperature fluctuations, so that the side surface of the shaped body, which is formed in particular as a light-emitting surface, remains substantially unchanged during operation of the device. Especially in the case of a device comprising a light-emitting component, for example, a semiconductor laser, the prevention or reduction of an asymmetric deformation of the light-emitting surface is of decisive importance for the adjustment or for the preservation of a light-emitting angle of the device. Without the reinforcement layer, as a result of temperature fluctuations, in the areas further away from the carrier plate, the shaped body would shrink or expand stronger than in the areas of the shaped body in the immediate vicinity of the carrier plate. This can result in the side surface of the shaped body or device, which is formed for instance as a light-emitting surface, being tilted or asymmetrically deformed along the vertical direction.

According to at least one embodiment of the device, the carrier plate, the shaped body and the reinforcement layer are formed with respect to their materials such that the coefficient of thermal expansion of the shaped body is at least ten times or at least twenty times as great as the coefficient of thermal expansion of the carrier plate and/or of the reinforcement layer.

According to at least one embodiment of the device, the coefficient of thermal expansion of the carrier plate differs from the coefficient of thermal expansion of the reinforcement layer by at most 300%, at most 200% or by at most 100%. It is possible that the carrier plate and the reinforcement layer are partially made of the same material.

According to at least one embodiment of the device, the carrier plate and the reinforcement layer are adapted to each other with respect to their layer thicknesses and moduli of elasticity such that a product of the layer thickness and the modulus of elasticity of the carrier plate differs from a product of the layer thickness and the modulus of elasticity of the reinforcement layer by at most 50%, by at most 30% or by at most 20%. The carrier plate and the reinforcement layer can therefore have similar bending strength, as a result of which asymmetric deformation of the shaped body is prevented or reduced. Preferably, the shaped body shows a product of its layer thickness and modulus of elasticity which is smaller than a corresponding product of the layer thickness and the modulus of elasticity of the carrier plate and/or of the reinforcement layer. The latter leads to a mechanically stable device. For example, a product of the layer thickness and the modulus of elasticity of the carrier plate and/or of the reinforcement layer is at least three times, at least five times or at least ten times as large as a product of the layer thickness and the modulus of elasticity of the shaped body.

According to at least one embodiment of the device, the shaped body has a layer thickness which is at least three times, six times or at least ten times or twenty times as great as a layer thickness of the carrier plate and/or of the reinforcement layer.

According to at least one embodiment of the device, the shaped body is a molded body. The shaped body is formed in particular from a radiation-transmissive material. In particular, the material of the shaped body is selected and the component is arranged in the shaped body in such a way that at least 70%, 80%, 90% or at least 95% of the radiation intensity generated by the component during operation of the device is decoupled at the radiation exit surface. For example, the shaped body contains casting resins, for instance synthetic resins, which are formed on the basis of silicone, polyurethane, epoxy or materials having similar material properties.

The shaped body is formed as a molded body if it can be produced for instance by a mold process. A mold process is generally understood to mean a process with which a casting material is shaped preferably under pressure into a molding compound, for instance into the shaped body, and cured if necessary. In particular, the term 'mold process' includes molding, film assisted molding, injection molding, transfer molding and compression molding. Alternatively or in addition, the shaped body can be produced by dosing technology or by dispensing technology, for example, by needle dosing.

In general, the material of the shaped body, in particular the casting material of the molded body, is first processed in liquid form and solidified or cured to form the shaped body. During solidification or curing, the shaped body can be deformed by thermal or chemical shrinkage of the casting material. If the reinforcement layer adjoins the shaped body or if the reinforcement layer is embedded in the shaped body, the deformation of the shaped body can be reduced or adjusted in a targeted manner.

According to at least one embodiment of the device, the carrier plate is a printed circuit board. In particular, the printed circuit board has a plastic base body and electrical conductor tracks arranged thereon. In particular, at least 70, 80, 90 or at least 95% by weight and/or volume % of the carrier plate are accounted for by the base body. The component can be electrically contacted via the conductor tracks. In particular, the component is a surface-mountable component which has a mounting surface facing the carrier plate having electrical and/or thermal connection points. In particular, the component is electrically connectable exclusively via its mounting surface. Deviating from this, it is possible that the component has at least one or more electrical connection points on a surface of the component facing away from the mounting surface, wherein the electrical connection points can each be electrically conductively connected to one of the conductor tracks for instance by a wire connection, for example, by a bonding wire.

According to at least one embodiment of the device, the carrier plate and the reinforcement layer are at least partially made of the same material. The reinforcement layer can be in the form of a printed circuit board, especially without conductor tracks. For example, the reinforcement layer and the base body of the carrier plate are made of the same material. It is also possible that the reinforcement layer is made of a plastic material that differs from the material of the base body of the carrier plate.

Preferably, a vertical layer thickness of the carrier plate or of the base body of the carrier plate differs by at most 50%, 40%, 30%, 20%, 10% or by at most 5% from a vertical layer thickness of the reinforcement layer. In comparison to the carrier plate, the reinforcement layer may have a lower vertical layer thickness and a higher modulus of elasticity. If the carrier plate and the reinforcement layer are substantially made of different materials, the carrier plate and the reinforcement layer may differ by more than 50%, 100% or by more than 200% in their vertical layer thicknesses.

According to at least one embodiment of the device, the reinforcement layer is a metal layer or a metal foil. The reinforcement layer contains a metal such as copper, aluminum, silver, nickel or similar metals or metal alloys. In a plan view of the carrier plate, the reinforcement layer can completely cover the electronic component. A metal foil is, for example, a self-supporting metal layer which has a vertical layer thickness much smaller, for example, at least five times, ten times or at least twenty times smaller than a lateral expansion of the metal layer.

According to at least one embodiment of the device, the reinforcement layer is flat and contiguous. In a plan view of the carrier plate, the reinforcement layer may cover at least 30%, 50%, 70% or at least 90% of the surface area of the carrier plate.

According to at least one embodiment of the device, the reinforcement layer is arranged on the shaped body, wherein the reinforcement layer spatially delimits the shaped body in a vertical direction. The reinforcement layer can be directly adjacent to the shaped body or attached to the shaped body by means of a connecting layer. Alternatively, it is possible that the reinforcement layer is embedded within the shaped body. The reinforcement layer can be completely enclosed by a material of the shaped body. Deviating from this, it is possible that along the lateral direction, the reinforcement layer extends as far as a side surface of the shaped body.

In a method for producing a device described here, the shaped body is applied to the carrier plate and to the component by a mold process. During the mold process or after the mold process, the reinforcement layer can be applied to the shaped body or embedded in the shaped body.

For example, the reinforcement layer, in particular the prefabricated reinforcement layer, can be introduced directly into the device, for instance into the shaped body, during the molding process. The reinforcement layer may be disposed on a molding machine, wherein the molding machine applies the reinforcement layer and the casting material to the carrier plate and to the component. Alternatively, it is possible that after the molding process, the reinforcement layer is subsequently applied to the casting compound or to the shaped body, for example, by gluing. In particular, the reinforcement layer is applied prior to a thermal treatment for curing the shaped body.

The method described above is particularly suitable for the production of a device described here. Thus, the features described in connection with the device can be used for the method and vice versa.

BRIEF DESCRIPTION OF THE DRAWINGS

Further advantages, preferred embodiments and further developments of the device or of the method will be apparent from the exemplary embodiments explained in the following in connection with FIGS. 1 to 5B.

FIG. 1 shows a comparison example of a device without a reinforcement layer;

FIGS. 2, 3 and 4 show schematic representations of various exemplary embodiments of a device comprising a reinforcement layer, each in sectional view; and FIGS. 5A and 5B show schematic representations of some method steps for the production of a device.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION OF ILLUSTRATIVE EMBODIMENTS

FIG. 1 schematically shows a comparison exemplary embodiment of a device 10 having a carrier plate 1, an electronic component 2 and a shaped body 3.

The carrier plate 1 has a base body 15 and electrical conductor tracks 16 arranged thereon. The carrier plate 1 is for instance a printed circuit board. The electronic component 2 is arranged on the carrier plate 1 and electrically connected to the electrical conductor tracks 16. FIG. 1 shows that the component 2 is electrically connectable partly via a front side facing away from carrier plate 1 and partly via a rear side of the component 2 facing away from carrier plate 1. In particular, an electrical connection point on the front side of the component 2 is electrically connected to one of the conductor tracks 16 via a wire connection. The rear side is formed in particular as a mounting surface of the component 2 and can have one or more electrical connection points which can be electrically connected to one or more electrical conductor tracks for instance via a solder connection. Deviating from FIG. 1, it is possible for the component 2 to be a surface-mountable component that is electrically contactable only via the mounting surface.

In lateral directions, the component 2 is completely enclosed by the shaped body 3. In a plan view, the shaped body 3 completely covers the component 2. According to FIG. 1, the device 10 has a front side 11 which is formed by a lateral exposed surface of the shaped body 3. The device 10 also has a rear side 12 which faces away from the front side 11 and is formed by a surface of the carrier plate 1, in particular by a surface of the base body 15. A vertical side surface 13 of the device 10 connecting the front side 11 with the rear side 12 or with the carrier plate 1 serves for instance as a radiation passage surface of the device 10, in particular as a radiation entry surface or as radiation exit surface of the device. The vertical side surface 13 of the device 10 may be formed mainly or exclusively by a lateral surface of the shaped body 3. The shaped body 3 is formed in particular to be radiation-transmissive.

The component 2 can be an optoelectronic component 2 which is especially configured to emit or detect electromagnetic radiations in the visible, ultraviolet or infrared spectral range during operation of the device 10. The device 10 may comprise a plurality of such electronic components 2 which are partially or completely embedded in the shaped body 3. According to FIG. 1, the device 10 has a further component 5 which can be electrically conductively connected to the component 2 and, for example, is configured to control the component 2. For example, the further component 5 is a driver chip. In a plan view of the carrier plate 1, the shaped body 3 completely covers the further component 5. In lateral directions, the further component 5 can be partially or completely enclosed by the shaped body 3. The further component 5 can be electrically contacted via the conductor tracks 16 of the carrier plate 1 and can be formed as a surface-mountable component.

For example, the component 2 is a laser diode, for instance an edge-emitting laser diode chip. In this case, the device 10 is a laser arrangement comprising an encapsulated laser diode, i.e., a laser package. In the case of a laser arrangement, the exit angle of a laser beam plays a decisive role in adjusting the beam divergence and the alignment of the laser beam. The exit angle should therefore be kept as constant as possible during operation of the device and also at different operating temperatures. If the side surface 13 serves as the radiation exit surface of the device 10, the electromagnetic radiation S generated by the component 2 is decoupled from device 10 at the side surface 13. The nature of the side surface 13 therefore has a great influence on the exit angle of the electromagnetic radiation S or on the alignment of the laser beam.

Due to the asymmetrical structure of the device 10, in general, it cannot be completely ruled out that the side surface 13 will be deformed due to temperature fluctuations. The temperature fluctuations can be temperature changes during the operation of the device 10 or temperature differences in different locations where device 10 is used. Compared to shaped body 3, the carrier plate 1 often has a lower coefficient of thermal expansion. The shaped body 3 can be a molded body formed from a casting material which generally has a much higher coefficient of thermal expansion and lower hardness than the carrier plate 1.

In the event of temperature fluctuations, the carrier plate 1 therefore impedes the expansion or shrinkage of the material, in particular of the casting material of the shaped body 3, for instance in regions at the level of the carrier plate 1, i.e., in the immediate vicinity of the carrier plate 1. The front side 11 of the device 10, which is formed in particular by a surface of the shaped body 3, has only contact with the surrounding air and is thus not or hardly impeded with respect to the thermal expansion or to the thermal shrinkage of the material of the shaped body 3.

Along the vertical direction, the shaped body 3 therefore expands to different degrees as the temperature changes. In particular, in the event of decreasing temperature changes, strong shrinkage will occur on the front side 11 of the device 10 while weaker shrinkage will occur in the immediate vicinity of the carrier plate 1. This results in a tilted side surface 13 of the shaped body 3 or of the device 10. The tilting of the side surface 13 or the deformation of the shaped body 3 is schematically indicated in FIG. 1 by the dashed line V. This effect can be counteracted by introducing a reinforcement layer 4 into the device 10, which is located on the front side 11 of the device 10, as shown in FIG. 2.

The exemplary embodiment of a device 10 shown in FIG. 2 essentially corresponds to the exemplary embodiment shown in FIG. 1. With the exception of the reinforcement layer 4, the exemplary embodiments for a device 10 shown in FIGS. 1 and 2 are essentially identical. As a further difference, directly on the carrier plate 1, the shaped body 3 has a step 33 which projects sidewards in the lateral direction beyond the remaining subregions of the side surface 13. The side surface 13 thus extends from the front side 11 to the step 33. The step 33 is located particularly in the immediate vicinity of the component 2. The step 33 of the shaped body 3 can serve to reduce a deformation of the side surface 13 in the immediate vicinity of the component 2.

According to FIG. 2, the reinforcement layer 4 is located on a surface of the shaped body 3 facing away from the carrier plate 1. In this case, the front side 11 of the device 10 is at least partially formed by a surface of the reinforcement layer 4. In the vertical direction, the shaped body 3 is arranged between the carrier plate 1 and the reinforcement layer 4. The component 2 embedded in the shaped body 3 is also arranged between the carrier plate 1 and the reinforcement layer 4. In FIG. 2, the reinforcement layer 4 does not extend along the lateral direction as far as the side surface 13. In contrast to this, it is possible that the reinforcement layer 4 may extend up to the side surface 13. In a plan view of the carrier plate 1, the reinforcement layer 4 can completely cover the electronic component 2 and/or the further component 5.

Especially together with the carrier plate 1, the reinforcement layer 4 is in particular formed to prevent or reduce an asymmetrical deformation of the shaped body 3 or of the side surface 13 along the vertical direction in the event of temperature fluctuations. Tilting or variation of the tilting of the side surface 13 due to temperature fluctuations can thus be prevented or reduced. Preferably, both the reinforcement layer 4 and the carrier plate 1 have a lower coefficient of thermal expansion than the shaped body 3. In other words, compared to a material of the shaped body 3, the material of the reinforcement layer 4 or of the carrier plate 1 is less strongly deformed, i.e., less strongly stretched or contracted, when the temperature changes. Preferably, the material of the shaped body 3 directly adjoins the reinforcement layer 4 and the carrier plate 1. In the event of temperature fluctuations, the deformation of the shaped body 3, in particular the asymmetrical deformation of the shaped body 3 along the vertical direction, can thus be effectively prevented or reduced.

The carrier plate 1, the shaped body 3 and the reinforcement layer 4 can be formed with respect to their materials in such a way that the coefficient of thermal expansion of the material forming the carrier plate 1 and/or the reinforcement layer 4 is at least three times, six times, ten times or at least twenty times smaller than a coefficient of thermal expansion of the material forming the shaped body 3.

If the shaped body 3 is made of a commercially available casting material, under normal conditions, it may have a coefficient of linear expansion between 50 ppm/K and 400 ppm/K inclusive, i.e., between $50*10^{-6}$ $K^{-1}$ and $400*10^{-6}$ $K^{-1}$ inclusive, or between 100 ppm/K and 400 ppm/K inclusive, i.e., between $100*10^{-6}$ $K^{-1}$ and $400*10^{-6}$ $K^{-1}$ inclusive. The carrier plate 1 and/or the reinforcement layer 4 may be formed of a material having, under normal conditions, a coefficient of linear expansion between $1*10^{-6}$ $K^{-1}$ and $40*10^{-6}$ $K^{-1}$ inclusive. For example, the carrier plate 1 is a printed circuit board which, except for the conductor tracks 16, is made mainly or exclusively from plastics, for example, from fiber-reinforced plastics. The reinforcement layer 4 can have fiber-reinforced plastics or can be a metal layer in particular in the form of a foil.

Preferably, the carrier plate 1 and the reinforcement layer 4 are adapted to each other with respect to their layer thicknesses and moduli of elasticity in such a way that a product of a layer thickness D1 and the modulus of elasticity of the carrier plate 1 differs from a product of the layer thickness D4 and the modulus of elasticity of the reinforcement layer 4 by at most 50%. In particular, the product of the layer thickness and the modulus of elasticity of the carrier plate 1 or of the reinforcement layer 4 is at least three times as large as a product of the layer thickness and the modulus of elasticity of the shaped body 3. This allows the carrier plate 1 and the reinforcement layer 4 to exhibit similar stiffness which, however, is significantly greater than that of the shaped body 3, so that the device 10 remains mechanically stable even in the case of significant temperature fluctuations and none of the carrier plate 1 and the reinforcement layer 4 bends early during the expansion or shrinkage of the shaped body 3. In particular, it can be achieved that a main extension surface of the carrier plate 1 and a main extension surface of the reinforcement layer 4 run substantially parallel to each other both before and after the deformation of the shaped body 3.

It is possible that the product of the layer thickness D1 and the modulus of elasticity of the carrier plate 1 is greater than the product of the layer thickness D4 and the modulus of elasticity of the reinforcement layer 4, or vice versa. In this case, the carrier plate 1 has a higher stiffness than the reinforcement layer 4, or vice versa. The layer thickness D1 of the carrier plate 1 may be between 60 μm and 600 μm inclusive, for instance between 100 μm and 600 μm inclusive, or between 100 μm and 400 μm inclusive. The layer thickness D4 of the reinforcement layer 4 may be between 20 μm and 300 μm inclusive, for instance between 30 μm and 300 μm inclusive, or between 50 μm and 200 μm inclusive.

Compared to the carrier plate 1, the reinforcement layer 4 may have a lower layer thickness and/or a lower coefficient of thermal expansion and/or a higher modulus of elasticity. The material of the shaped body 3 generally has a significantly lower modulus of elasticity than the material of the reinforcement layer 4 and/or of the carrier plate 1. The shaped body 3 can therefore have a vertical layer thickness which is significantly greater, for example, at least three times greater, than a layer thickness of the carrier plate 1 and/or of the reinforcement layer 4.

Using the reinforcement layer 4, an asymmetrical deformation of the shaped body 3 or of the side surface 13 can be reduced or avoided. Right after the curing of the shaped body 3A, a side surface 13 of the device 10 can be formed in a simplified manner which is perpendicular or essentially perpendicular to the main extension surface of the carrier plate 1. Depending on the application, if a tilting of the side surface 13 is intended, a tilting angle of the side surface 13 can be adjusted by a specific arrangement of the reinforcement layer 4 in the shaped body 3. For example, prior to the curing of the shaped body 3, the reinforcement layer 4 can be inserted into the device 10 in such a way that a specified lateral distance between the reinforcement layer 4 and the side surface 13 is maintained. During the curing process, the material of the shaped body 3 shrinks to different degrees along the vertical direction so that the desired tilting angle of the side surface 13 can be set. In comparison to the curing process, in general, the temperature fluctuations during the operation of the device 10 are much lower, so that the tilting angle is essentially maintained after the curing of the shaped body 3.

Due to possible varying operating temperatures or temperature fluctuations during the operation of the device 10, the side surface 13 can be slightly deformed, the side surface 13 or the shaped body 3, however, is not tilted only on one side in the presence of the reinforcement layer 1 as shown in FIG. 1, but has a symmetrical or substantially symmetrical deformation V (FIGS. 3 and 4). In other words, the tilting or variation in the tilting of the side surface 13 due to temperature fluctuations can be prevented or reduced. In comparison with an asymmetrical deformation V (FIG. 1), the substantially symmetrical deformation V with respect to a lateral plane, for example, in the form of a protrusion in the case of the expansion of the material of the shaped body 3 (FIG. 3) or in the form of a recess in the case of the shrinkage of the material of the shaped body 3 (FIG. 4), has a significantly lower influence on the change in optical properties of the device 10 with temperature fluctuations.

The exemplary embodiment shown in FIG. 3 essentially corresponds to the exemplary embodiment of a device 10 shown in FIG. 2. In contrast to this, the reinforcement layer 4 extends along the lateral direction up to the side surface 13, which serves for instance as the radiation passage surface, in particular as the radiation exit surface of the device 10. The possible deformation of the side surface 13, for instance when the shaped body 3 is stretched during operation of the device 10, is indicated in FIG. 3 by the dashed curve V.

The exemplary embodiment shown in FIG. 4 essentially corresponds to the exemplary embodiment of a device 10 shown in FIG. 3. According to FIG. 3, the reinforcement layer 4 is arranged on the shaped body 3. The reinforcement layer 4 thus delimits the shaped body 3 in a vertical direction. The front side 11 of the device 10 is formed in particular by an exposed surface of the reinforcement layer 4. In contrast to this, the reinforcement layer 4 as shown in FIG. 4 is embedded in the shaped body 3. The reinforcement layer 4 is thus arranged in the shaped body 3, wherein the reinforcement layer 4 can extend along the lateral direction up to the side surface 13. The front side 11 of the device 10 is formed in particular by an exposed surface of the shaped body 3. The possible deformation of the side surface 13, for instance in the case of shrinkage of the shaped body 3 during operation of the device 10, is indicated in FIG. 4 by a dashed curve V.

FIG. 5A schematically shows a method step for the production of a plurality of the devices 10 which are described, for example, in FIG. 2 or 3. A plurality of the components 2 and further components 5 may be arranged in rows and columns on the carrier plate 1 before the shaped body 3 is applied to the carrier plate 1 and to the components 2 and 5 by a mold process, in particular using a molding machine 6. The reinforcement layer 4 or a plurality of reinforcement layers 4 can be attached to the molding machine 6 and is applied to the shaped body 3, especially during the molding process.

In particular, the molding machine 6 is formed in such a way that it imprints the side surfaces 13. For example, the molding machine 6 has projections which are arranged between adjacent devices 10 and thus imprint the side surfaces 13. The material of shaped body 3 can directly adjoin the protrusions of molding machine 6. For example, the molding machine 6 is arranged relative to the carrier plate 1 in such a way that a vertical distance is maintained between the carrier plate 1 and the projections. In particular, this vertical distance defines a vertical height of the step 33. The step 33 between two adjacent devices 10 can thus be formed in a simplified manner.

In a plan view, the reinforcement layer 4 can cover, in particular completely cover exactly one component 2 or several components 2. It is also possible that only after the mold process, the reinforcement layer 4 or a plurality of the reinforcement layers 4 is/are arranged, for example, glued on the shaped body 3. For instance at the location of step 33, for example, along the step 33, the carrier plate 1 and the shaped body 4 with the components 2 and 5 embedded therein can be singulated into a plurality of the devices 10 before or after a curing process.

FIG. 5B schematically shows a method step for the production of a plurality of the devices 10 shown for instance in FIG. 4. This method step essentially corresponds to the method step shown in FIG. 5A. In contrast, the reinforcement layer 4 or the plurality of the reinforcement layers 4 is/are embedded in the shaped body 3. FIGS. 2 to 5B show that the further components 5 are embedded in the shaped body 3 only in places. Deviating from this, it is possible that the further components 5 in each case are completely embedded in the corresponding shaped body 3 in a similar way to the components 2.

Using a reinforcement layer within or on a front side of a shaped body, a favorable and efficient device can be realized which has a component embedded in the shaped body and arranged for instance between a carrier plate and the reinforcement layer. The reinforcement layer can provide additional mechanical protection for the device. The reinforcement layer can also be used for screening the component or device from external electromagnetic radiation. If the component is a laser diode and a side surface of the shaped body is formed as a radiation exit surface of the device, due to the presence of the reinforcement layer, temperature-dependent tilting of the radiation exit surface can be avoided or reduced to a large extent, as a result of which optical properties of the device, in particular with regard to the alignment and divergence of the laser beam, can be made stable against temperature fluctuations.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the patent claims or exemplary embodiments.

The invention claimed is:
1. A device comprising:
a carrier plate;
an electronic component;
a shaped body; and
a reinforcement layer,
wherein the electronic component is laterally enclosed by the shaped body,
wherein, in a vertical direction, the electronic component is arranged between the carrier plate and the reinforcement layer,
wherein the shaped body has a thermal expansion coefficient which is at least three times as large as a thermal expansion coefficient of the carrier plate and at least three times as large as a thermal expansion coefficient of the reinforcement layer, and
wherein the carrier plate and the reinforcement layer adjoin the shaped body at least in places and are configured to reduce deformation of the shaped body in an event of temperature fluctuations.

2. The device according to claim 1, wherein the electronic component is an optoelectronic component, wherein the shaped body has a side surface serving as a light passage surface of the device, and wherein the carrier plate and the reinforcement layer are configured to reduce deformation of the side surface in the event of temperature fluctuations.

3. The device according to claim 1, wherein the electronic component is a laser diode, and wherein the shaped body has a side surface forming a light-emitting surface of the device.

4. The device according to claim 1, wherein the carrier plate, the shaped body and the reinforcement layer are formed with respect to their materials in such a way that the coefficient of thermal expansion of the shaped body is at least ten times greater than the coefficient of thermal expansion of the carrier plate or of the reinforcement layer.

5. The device according to claim 1, wherein the coefficient of thermal expansion of the carrier plate differs by at most 300% from the coefficient of thermal expansion of the reinforcement layer.

6. The device according to claim 1, wherein the carrier plate and the reinforcement layer are adapted to one another in such a way that a product of a layer thickness and a modulus of elasticity of the carrier plate differs by at most 50% from a product of a layer thickness and a modulus of elasticity of the reinforcement layer.

7. The device according to claim 1, wherein a product of a layer thickness and a modulus of elasticity of the carrier plate or of the reinforcement layer is at least three times as large as a product of a layer thickness and a modulus of elasticity of the shaped body.

8. The device according to claim 1, wherein the shaped body is a molded body comprising a radiation-transmissive material.

9. The device according to claim 1, wherein the shaped body has a layer thickness which is at least three times as large as a layer thickness of the carrier plate or of the reinforcement layer.

10. The device according to claim 1, wherein the carrier plate is a printed circuit board comprising a plastic base body and electrical conductor tracks arranged thereon.

11. The device according to claim 1, wherein the reinforcement layer is a metal layer or a metal foil, and wherein, in a plan view of the carrier plate, the reinforcement layer completely covers the electronic component.

12. The device according to claim 1, wherein in comparison with the carrier plate, the reinforcement layer has a lower layer thickness and a higher modulus of elasticity.

13. The device according to claim 1, wherein the carrier plate and the reinforcement layer comprise at least in parts the same material, and wherein a layer thickness of the carrier plate differs by at most 50% from a layer thickness of the reinforcement layer.

14. The device according to claim 1, wherein the reinforcement layer is arranged on the shaped body and spatially delimits the shaped body in the vertical direction.

15. The device according to claim 1, wherein the reinforcement layer is embedded in the shaped body.

16. The device according to claim 1, wherein the shaped body has a side surface and, directly on the carrier plate, a step projecting laterally in a lateral direction beyond remaining subregions of the side surface.

17. A method for producing the device according to claim 1, the method comprising:
applying the shaped body to the carrier plate and to the electronic component by a mold method; and
applying the reinforcement layer to the shaped body or embedding the reinforcement layer in the shaped body.

18. A method for producing the device according to claim 1, the method comprising:
forming the shaped body by dosing technology or by dispensing technology.

* * * * *